US012787808B2

(12) United States Patent
Chiang et al.

(10) Patent No.: US 12,787,808 B2
(45) Date of Patent: Nov. 3, 2026

(54) SEMICONDUCTOR DEVICE HAVING GROUNDED BURIED OXIDE LAYER

(71) Applicant: UNITED MICROELECTRONICS CORP., Hsin-Chu City (TW)

(72) Inventors: Chung-Sung Chiang, Kaohsiung City (TW); Yu-Ping Wang, Hsinchu City (TW); I-Ming Tseng, Kaohsiung City (TW); Yu-Chun Chen, Kaohsiung City (TW); Yi-An Shih, Changhua County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 359 days.

(21) Appl. No.: 18/406,226

(22) Filed: Jan. 8, 2024

(65) Prior Publication Data

US 2025/0194230 A1 Jun. 12, 2025

(30) Foreign Application Priority Data

Dec. 8, 2023 (TW) ................................ 112147850

(51) Int. Cl.

| | |
|---|---|
| ***H10D 84/80*** | (2025.01) |
| ***H10D 86/00*** | (2025.01) |
| ***H10W 70/05*** | (2026.01) |
| ***H10W 70/60*** | (2026.01) |
| ***H10W 70/63*** | (2026.01) |
| ***H10W 70/65*** | (2026.01) |
| ***H10W 70/685*** | (2026.01) |

(Continued)

(52) U.S. Cl.
CPC ........ *H10W 70/611* (2026.01); *H10D 84/811* (2025.01); *H10W 70/05* (2026.01); *H10W 70/63* (2026.01); *H10W 70/65* (2026.01); *H10W 70/685* (2026.01); *H10W 90/401* (2026.01); *H10D 86/201* (2025.01); *H10D 88/00* (2025.01)

(58) Field of Classification Search
CPC ... H10W 70/05; H10W 70/611; H10W 70/63; H10W 70/65; H10W 70/685; H10W 90/401; H10D 84/811
See application file for complete search history.

(56) References Cited

U.S. PATENT DOCUMENTS 10,290,611 B2 5/2019 Yu et al.
2016/0093591 A1* 3/2016 Lan ......................... H10P 72/74 438/107

(Continued)

*Primary Examiner* — Yara B Green
*Assistant Examiner* — Christopher M Roland
(74) *Attorney, Agent, or Firm* — Winston Hsu

(57) ABSTRACT

A semiconductor device includes a first wafer, a second wafer, a dielectric layer and a first metal structure. The first wafer includes a first substrate and a first interconnection layer disposed on the first substrate. The second wafer includes a second substrate and a second interconnection layer. The second substrate includes a buried oxide layer and a semiconductor layer disposed on the buried oxide layer. The second interconnection layer is disposed on the semiconductor layer, in which the second interconnection layer is bonded with the first interconnection layer. The dielectric layer is disposed on the buried oxide layer. The first metal structure is disposed through the dielectric layer, in which an end of the first metal structure physically contacts the buried oxide layer, and the buried oxide layer is grounded through the first metal structure.

10 Claims, 7 Drawing Sheets

(51) Int. Cl.
*H10W 90/00* (2026.01)
*H10D 88/00* (2025.01)

(56) References Cited

U.S. PATENT DOCUMENTS

| | | | | |
|---|---|---|---|---|
| 2020/0135617 | A1* | 4/2020 | Shen | H10D 84/038 |
| 2021/0082873 | A1* | 3/2021 | Chen | H10W 20/023 |
| 2021/0391302 | A1* | 12/2021 | Kao | H10W 20/023 |
| 2022/0130956 | A1* | 4/2022 | Yang | H10D 62/118 |
| 2022/0415930 | A1* | 12/2022 | Chuang | H10D 87/00 |
| 2024/0371758 | A1* | 11/2024 | Chen | H10W 20/075 |
| 2024/0387418 | A1* | 11/2024 | Chen | H10W 20/081 |
| 2025/0142958 | A1* | 5/2025 | Hou | H10D 86/201 |

* cited by examiner

SEMICONDUCTOR DEVICE HAVING GROUNDED BURIED OXIDE LAYER

BACKGROUND OF THE INVENTION

1. Field of the Invention

The present disclosure relates to the field of semiconductor devices, and more particularly, to a bonded semiconductor device and a method for fabricating the same.

2. Description of the Prior Art

A three-dimensional integrated circuit (3D IC) refers to a three-dimensional stack of chips formed by using wafer-level bonding and through silicon via (TSV) technologies. In comparison with conventional two-dimensional chips, the 3D IC may have the advantages of using the space more effectively, shorter signal transmission distances between chips, and lower interconnecting resistances. As a result, 3D IC have gradually become the mainstream technology of power converters, low noise amplifiers, radio frequency (RF) or millimeter wave (MMW) components. Therefore, how to improve the properties of 3D IC, such as the electrical performance of 3D IC, has become a goal of relevant industries.

SUMMARY OF THE INVENTION

According to one aspect of the present disclosure, a semiconductor device includes a first wafer, a second wafer, a dielectric layer and a first metal structure. The first wafer includes a first substrate and a first interconnection layer disposed on the first substrate. The second wafer includes a second substrate and a second interconnection layer. The second substrate includes a buried oxide layer and a semiconductor layer disposed on the buried oxide layer. The second interconnection layer is disposed on the semiconductor layer, in which the second interconnection layer is bonded with the first interconnection layer. The dielectric layer is disposed on the buried oxide layer. The first metal structure is disposed through the dielectric layer, in which an end of the first metal structure physically contacts the buried oxide layer, and the buried oxide layer is grounded through the first metal structure.

According to another aspect of the present disclosure, a method for fabricating a semiconductor device includes steps as follows. A first wafer is provided, in which the first wafer includes a first substrate and a first interconnection layer disposed on the first substrate. A second wafer is provided, in which the second wafer includes a second substrate and a second interconnection layer, the second substrate includes a buried oxide layer and a semiconductor layer disposed on the buried oxide layer, and the second interconnection layer is disposed on the semiconductor layer. The second interconnection layer is bonded the with first interconnection layer. A dielectric layer is formed on the buried oxide layer. A first metal structure is formed through the dielectric layer, in which an end of the first metal structure physically contacts the buried oxide layer, and the buried oxide layer is grounded through the first metal structure.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure(s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various elements, regions, layers and/or sections, these elements, regions, layers and/or sections should not be limited by these terms. These terms may be only used to distinguish one element, region, layer and/or section from another element, region, layer and/or section. Terms such as "first," "second," and other numerical terms when used herein do not imply a sequence or order unless clearly indicated by the context. Thus, a first element, region, layer and/or section discussed below could be termed a second element, region, layer and/or section without departing from the teachings of the embodiments. The terms used in the claims may not be identical with the terms used in the specification, but may be used according to the order of the elements claimed in the claims.

Figure 1:
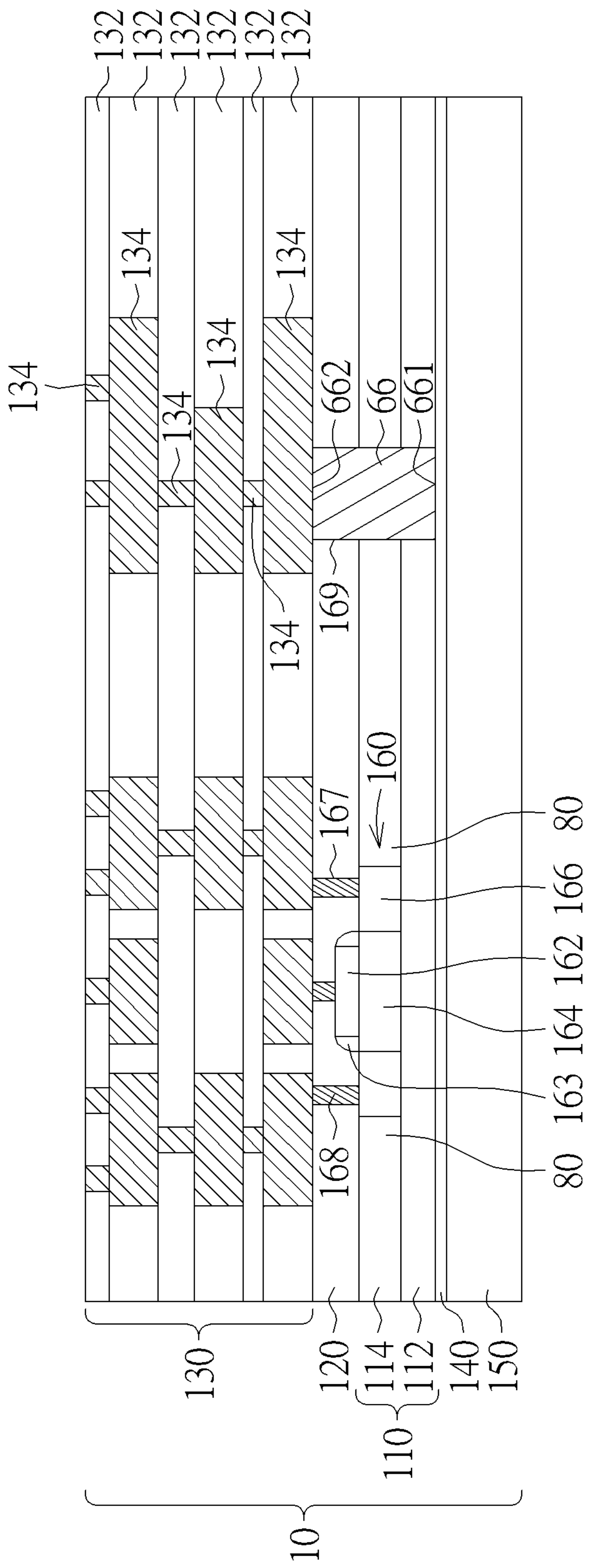
FIG. 1, FIG. 2, FIG. 3, FIG. 4, FIG. 5, FIG. 6 and FIG. 7 are schematic cross-sectional views showing steps of a method for fabricating a semiconductor device according to an embodiment of the present disclosure.

Please refer to FIG. 1 to FIG. 7, which are schematic cross-sectional views showing steps of a method for fabricating a semiconductor device according to an embodiment of the present disclosure. In FIG. 1, a first wafer 10 is provided first. The first wafer 10 includes a first substrate 110 and a first interconnection layer 130. The first interconnection layer 130 is disposed on the first substrate 110.

For example, the first wafer 10 may be fabricated as follows. First, the first substrate 110 may be provided first. The first substrate 110, for example, may be a silicon on insulator (SOI) substrate, which mainly includes a semiconductor layer (not shown, also called bottom semiconductor layer below for the convenience of explanation), a buried oxide layer 112 disposed on the bottom semiconductor layer, and another semiconductor layer 114 (also called top semiconductor layer) disposed on the buried oxide layer 112. The materials of the aforementioned bottom semiconductor layer (not shown) and the semiconductor layer 114 may be the same or different, and may independently include silicon, germanium, silicon germanium or a combination thereof, and the material of the buried oxide layer 112 may include silicon dioxide, but not limited thereto.

Next, a portion of the semiconductor layer 114 may be removed to form a shallow trench isolation (STI) 80 surrounding an active region (not labeled). The active region surrounded by the shallow trench isolation 80 may be configured to disposed active elements, such as a first transistor 160.

Next, the first transistor 160 is formed in the first substrate 110. In the embodiment, the first transistor 160 is exemplarily an N-type metal oxide semiconductor (NMOS) transistor for explanation, but the present disclosure is not limited thereto. The first transistor 160 includes a well region 164 disposed in the semiconductor layer 114 surrounded by the shallow trench isolation 80, a gate structure 162 disposed on the semiconductor layer 114 surrounded by the shallow trench isolation 80 and located above the well region 164, a spacer 163 disposed on the sidewall of the gate structure 162, and two source/drain regions 166 disposed in the semiconductor layer 114 at two sides of the spacer 163. The conductivity types of the two source/drain regions 166 are the same with each other and are different from the conductivity type of the well region 164. Herein, because the first transistor 160 is exemplarily an NMOS transistor, the well region 164 is a P-type well region which may be doped with P-type dopants, such as boron, indium, etc., and the source/drain regions 166 are N-type source/drain regions which may be doped with N-type dopants, such as arsenic, phosphorus, etc.

The gate structure 162 may include a gate dielectric layer (not shown) and a gate material layer (not shown) from bottom to top. The material of the gate dielectric layer may include silicon dioxide, silicon nitride or a high dielectric constant (high-k) material. The material of the gate material layer may include a conductive material, such as doped polycrystalline silicon, doped amorphous silicon, metal or metal compounds. However, the present disclosure is not limited thereto. The gate structure 162 may include other material layers depending on actual needs. For example, the gate structure 162 may optionally include one or more work function metal layers and/or barrier layers disposed between the gate dielectric layer and the gate material layer. The spacer 163 may be a single material layer or a stack of material layers. The material of the spacer 163 may include an oxide and/or a nitride, such as silicon dioxide, silicon nitride, silicon oxynitride or silicon carbonitride.

Next, a dielectric layer 120 is formed on the first substrate 110 to cover the first transistor 160. Before forming the dielectric layer 120, a contact etch stop layer (CESL) (not shown) may be optionally formed on the first substrate 110 to cover the first transistor 160. The material of the dielectric layer 120 may exemplarily include oxide, such as an silicon dioxide, borophosphosilicate glass (BPSG), tetraethoxysilane (TEOS), spin-on glass (SOG), undoped silicate glass (USG) or fluorinated silicate glass (FSG), and the material of the CESL may exemplarily include silicon nitride, but not limited thereto.

Next, semiconductor processes, such as lithography and etching processes, may be performed to remove a portion of the dielectric layer 120 and a portion of the CESL to form a plurality of contact holes 167 to expose the gate structure 162 and the two source/drain regions 166 of the first transistor 160. Next, a contact plug process is performed. For example, a conductive layer (not shown) may be firstly formed to fill the contact holes 167 completely, and then a planarization process such as a chemical mechanical polishing (CMP) process may be performed to remove a portion of the conductive layer, so as to form a plurality of contact plugs 168 in the dielectric layer 120 to be electrically connected with the gate structure 162 and the two source/drain regions 166. The top surface of the contact plug 168 may be aligned with the top surface of the dielectric layer 120.

Next, semiconductor processes, such as lithography and etching processes, may be performed to remove a portion of the dielectric layer 120, a portion of the CESL, a portion of the semiconductor layer 114 (or the shallow trench isolation 80 disposed in the semiconductor layer 114) and a portion of the buried oxide layer 112 to form the contact holes 169. Next, another contact plug process may be performed. For example, a conductive layer (not shown) may be firstly formed to fill the contact hole 169 completely, and then a planarization process such as a CMP process may be performed to remove a portion of the conductive layer, so as to form a third metal structure 66 disposed through the dielectric layer 120, and the semiconductor layer 114 (or the shallow trench isolation 80 disposed in the semiconductor layer 114) and the buried oxide layer 112 of the first substrate 110. That is, the third metal structure 66 is a through silicon via (TSV).

The materials of the conductive layers forming the contact plugs 168 and the third metal structure 66 may be the same or different, and may independently include a barrier layer (not shown) and a metal layer (not shown). The material of the barrier layer may include titanium, tantalum, titanium nitride, tantalum nitride, nitrogen or a combination thereof, and the material of the metal layer may include aluminum, titanium, tantalum, tungsten, niobium, molybdenum, copper or a combination thereof, but not limited thereto.

Afterward, a metal interconnection process may be performed to form the first interconnection layer 130 on the dielectric layer 120. For example, a stop layer (not shown) and an inter-metal dielectric layer 132 may be formed sequentially on the surface of the dielectric layer 120, and then one or more lithography and etching processes may be performed to remove a portion of the inter-metal dielectric layer 132 and a portion of the stop layer to form contact holes (not labeled). Next, a conductive material is completely filled into each of the contact holes and a planarization process such as a CMP process is performed to form metal interconnections 134 to connect the contact plugs 168 and the third metal structure 66 below. The above process may be repeated to form the first interconnection layer 130 including a plurality of layers with the inter-metal dielectric layers 132 and the metal interconnections 134 on the dielectric layer 120 according to process requirements, so as to complete the back-end-of-the-line (BEOL) process. The material of metal interconnections 134 may be the same as that of the third metal structure 66, and are not repeated herein. Next, the bottom semiconductor layer of the first substrate 110 may be completely removed by a CMP process to expose the bottom of the third metal structure 66.

It is noted that of the first wafer 10 according to the present disclosure may be optionally formed with a trap rich layer 140 and a supporting substrate 150 on the back side of the first substrate 110. For example, the trap rich layer 140 may be firstly formed on the supporting substrate 150, and then an oxide layer (not shown) for bonding with the buried oxide layer 112 may be formed on the trap rich layer 140. Next, the first substrate 110 is thinned to remove the bottom semiconductor layer of the first substrate 110. Next, the thinned first substrate 110 is bonded with the supporting substrate 150 formed with the trap rich layer 140. The supporting substrate 150 may be, for example, a high-resistance silicon substrate with an extremely low doping amount. The trap rich layer 140 may be formed, for example, by depositing a high-resistance material on the supporting substrate 150. The high-resistance material may be a polycrystalline semiconductor material or an amorphous semiconductor material, such as polycrystalline silicon or amorphous silicon. Alternatively, the trap rich layer 140 may be formed by an ion implantation process to bombard and destroy the surface of the supporting substrate 150 with high-energy particles. The oxide layer may be a superficial oxide layer, and the material of the oxide layer may be the same as the buried oxide layer 112 to provide better interface performance, but not limited thereto. With the trap rich layer 140, it is beneficial to reduce nonlinear parasitic capacitance and parasitic surface conduction. Accordingly, it is beneficial to reduce noises. Thereby, the fabrication of the first wafer 10 is completed. Furthermore, in other embodiments of the present disclosure, a SOI substrate which already has the trap rich layer 140 may be directly used as the first substrate 110, and then the aforementioned structures, such as the first transistor 160, the third metal structure 66 and the metal interconnections 134, are sequentially formed thereon.

Figure 2:
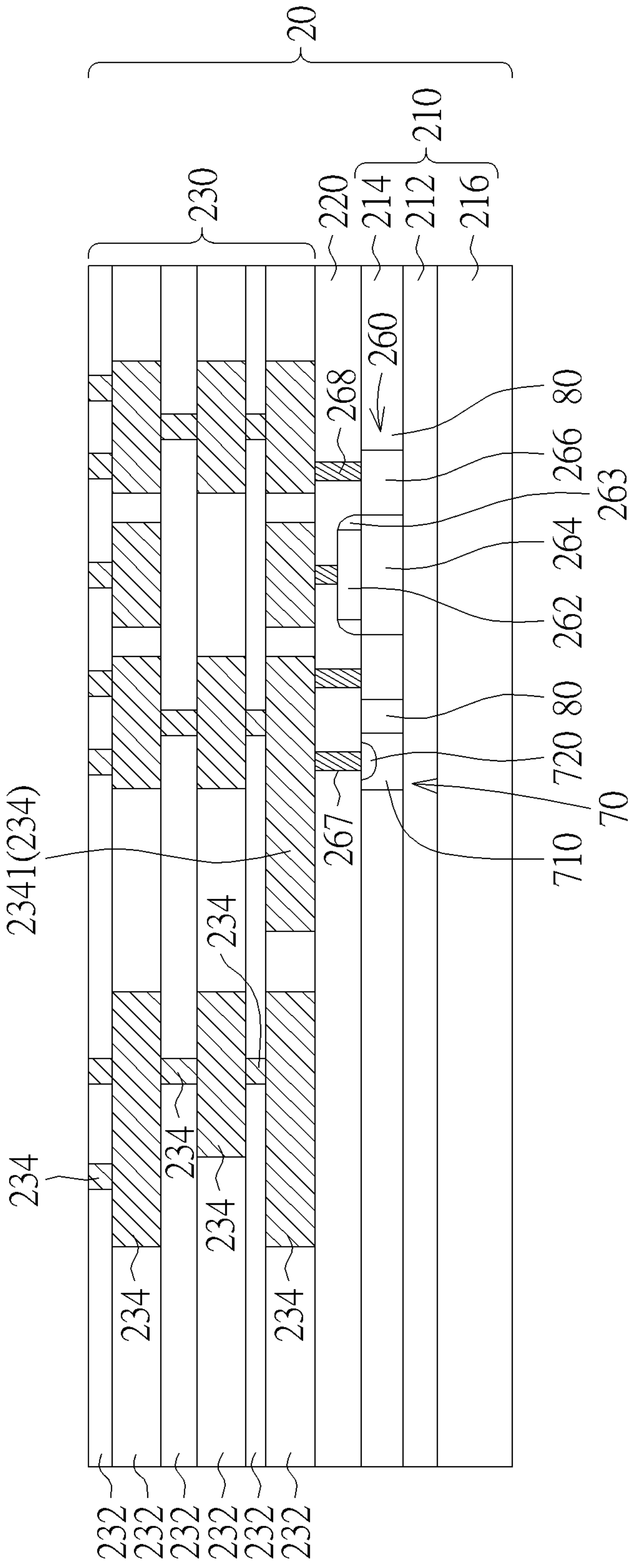

Next, as shown in FIG. 2, a second wafer 20 is provided. The second wafer 20 includes a second substrate 210 and a second interconnection layer 230. The second interconnection layer 230 is disposed on the semiconductor layer 214 of the second substrate 210. For example, the second wafer 20 may be fabricated as follows. First, the second substrate 210 may be provided first. The second substrate 210, for example, may be a silicon on insulator (SOI) substrate, which mainly includes a semiconductor layer 216 (also called bottom semiconductor layer), a buried oxide layer 212 disposed on the semiconductor layer 216, and another semiconductor layer 214 (also called top semiconductor layer) disposed on the buried oxide layer 212. For details of the second substrate 210, references may be made to the above description relating to the first substrate 110 and are not repeated herein.

Next, a portion of the semiconductor layer 214 may be removed to form a shallow trench isolation 80 surrounding an active region (not labeled). The active region surrounded by the shallow trench isolation 80 may be configured to disposed active elements, such as a second transistor 260.

Next, the second transistor 260 and a diode 70 are formed in the second substrate 210. In the embodiment, the second transistor 260 is exemplarily an NMOS transistor for explanation, but the present disclosure is not limited thereto. The second transistor 260 includes a well region 264 disposed in the semiconductor layer 214 surrounded by the shallow trench isolation 80, a gate structure 262 disposed on the semiconductor layer 214 surrounded by the shallow trench isolation 80 and located above the well region 264, a spacer 263 disposed on the sidewall of the gate structure 262 and two source/drain regions 266 disposed in the semiconductor layer 214 at two sides of the spacer 263. For details of the second transistor 260, references may be made to the above description relating to the first transistor 160 and are not repeated herein. The diode 70 includes an N-type doped region 710 and a P-type doped region 720, and a doping concentration of the P-type doped region 720 may be higher than that of the N-type doped region 710. The N-type doped region 710 may be doped with N-type dopants, such as arsenic, phosphorus, etc. The P-type doped region 720 may be doped with P-type dopants, such as boron, indium, etc.

Next, a dielectric layer 220 is formed on the second substrate 210 to cover the second transistor 260. Before forming the dielectric layer 220, a CESL (not shown) may be optionally formed on the second substrate 210 to cover the second transistor 260. Next, semiconductor processes, such as lithography and etching processes, may be used to remove a portion of the dielectric layer 220 and a portion of the CESL to form a plurality of contact holes 267 to expose the gate structure 262 and the two source/drain regions 266 of the second transistor 260 and the P-type doped region 720 of the diode 70. Next, a contact plug process is performed, so as to form a plurality of contact plugs 268 in the dielectric layer 220 to be electrically connected with the gate structure 262, the two source/drain regions 266 and the P-type doped region 720. The top surface of the contact plug 268 may be aligned with the top surface of the dielectric layer 220. For details of the dielectric layer 220 and the contact plugs 268, references may be made to the above description relating to the dielectric layer 120 and the contact plugs 168, and are not repeated herein.

Afterward, a metal interconnection process may be performed to form the second interconnection layer 230 on the dielectric layer 220. For example, a stop layer (not shown) and an inter-metal dielectric layer 232 may be formed sequentially on the surface of the dielectric layer 220, and then one or more lithography and etching processes may be performed to remove a portion of the inter-metal dielectric layer 232 and a portion of the stop layer to form contact holes (not shown). Next, a conductive material is filled into each of the contact holes completely and a planarization process such as a CMP process is performed to form metal interconnections 234 to connect the contact plugs 268 below and the first metal structure 62 (see FIG. 5), the second metal structure 64 (see FIG. 5) and the fourth metal structure 68 (see FIG. 5) formed in the following steps. For details of the inter-metal dielectric layer 232 and the metal interconnections 234, references may be made to the above description relating to the inter-metal dielectric layer 132 and the metal interconnections 134, and are not repeated herein. Thereby, the fabrication of the second wafer 20 is completed.

Figure 3:
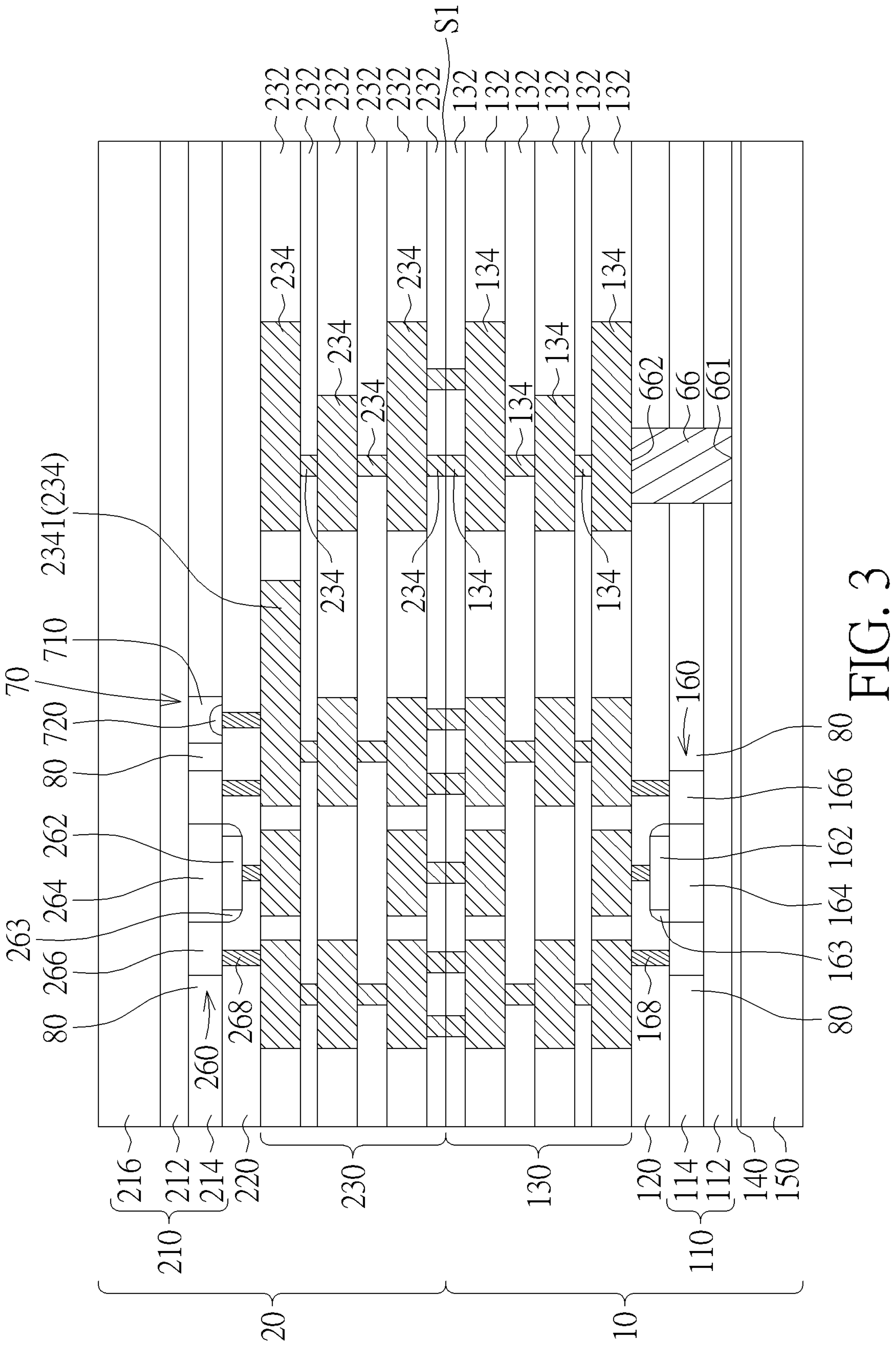
Figure 4:
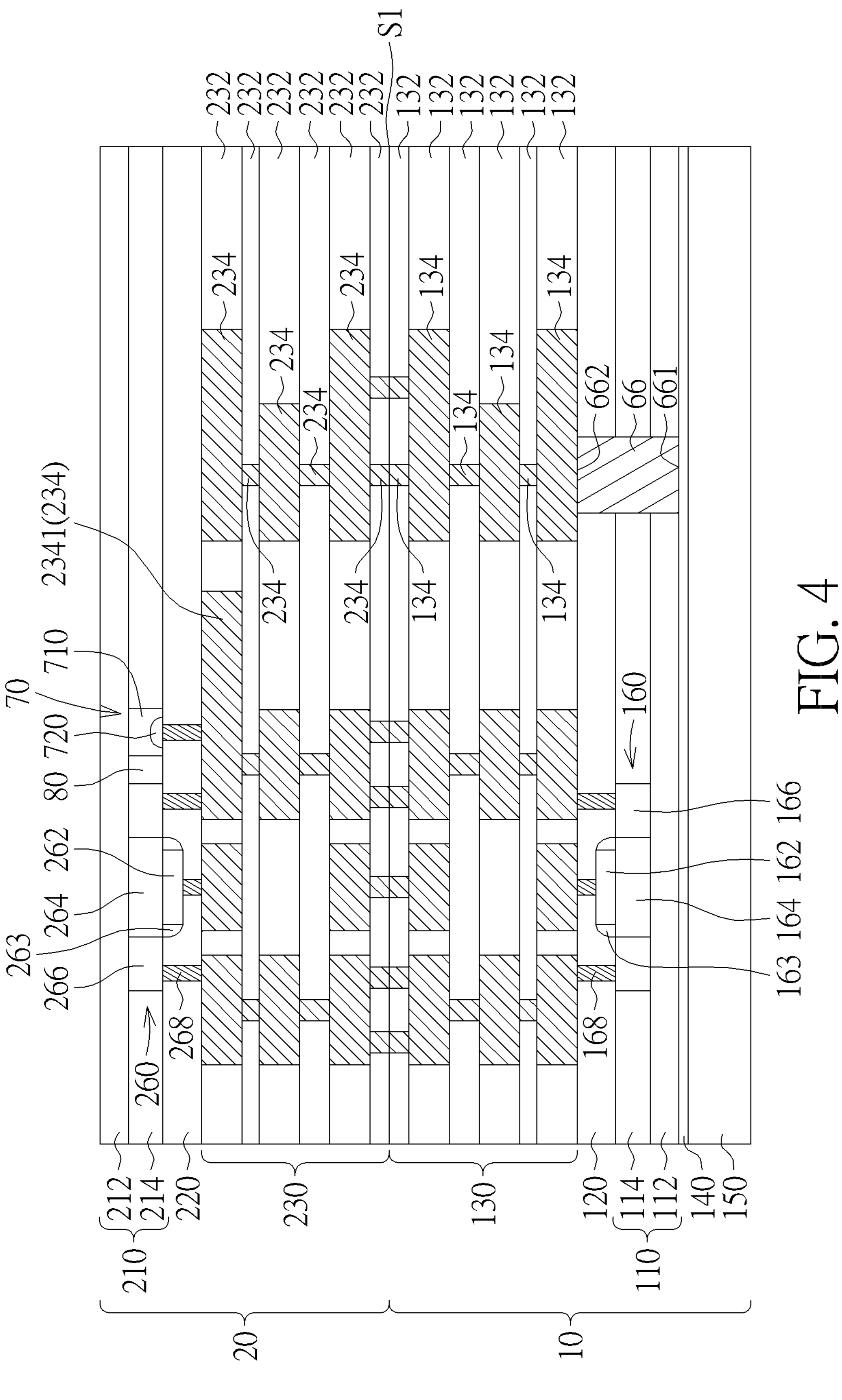

Next, as shown in FIG. 3, the back side of the second wafer 20 is turned to face up. Next, a bonding process such as a hybrid bonding technology is performed, in which the metal interconnections 134 and 234 embedded in the inter-metal dielectric layers 132 and 232 are aligned to contact each other face to face, and then a thermal treatment is performed, so that the second interconnection layer 230 of the second wafer 20 and the first interconnection layer 130 of the first wafer 10 are bonded through the atomic diffusion of the metal in the solid state. Next, as shown in FIG. 4, a thinning process is performed. For example, the semiconductor layer 216 of the second substrate 210 may be completely removed by a CMP process. However, during the process of removing the semiconductor layer 216, charges (not shown) may be accumulated in the buried oxide layer 212. The charges accumulated in the buried oxide layer 212 may affect the electrical performance of the second transistor 260. For example, the breakdown voltage of the second transistor 260 may be reduced.

Figure 5:
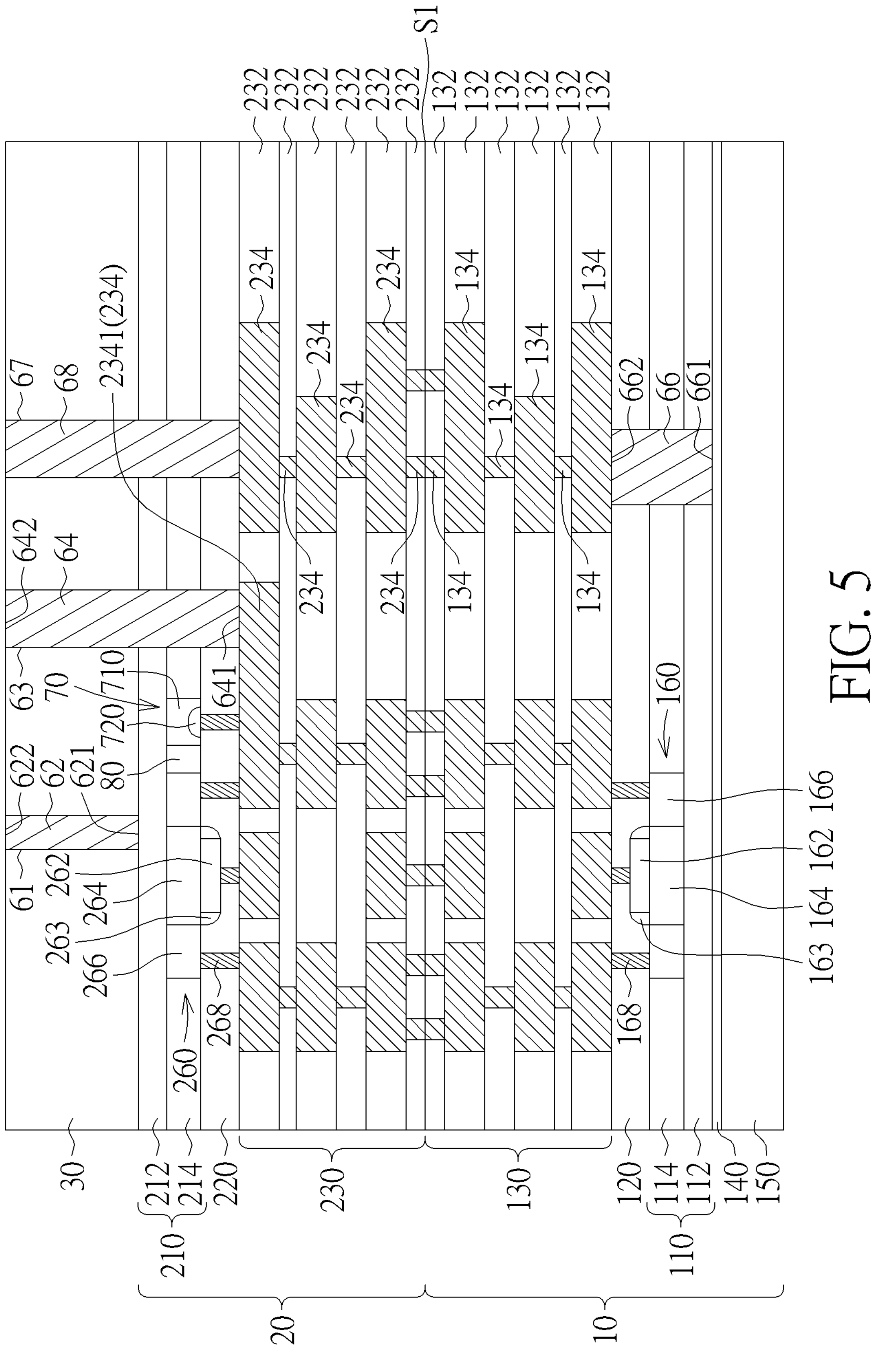

Next, as shown in FIG. 5, a dielectric layer 30 is formed on the buried oxide layer 212 of the second substrate 210. The material of the dielectric layer 30 may exemplarily include silicon nitride, but not limited thereto. Next, contact holes 61, 63 and 67 may be formed through semiconductor processes, such as lithography and etching processes. Next, a contact plug process is performed. For example, a conductive layer (not shown) may be firstly formed to completely fill the contact holes 61, 63 and 67, and then a planarization process such as a CMP process may be performed to remove a portion of the conductive layer, so as to form the first metal structure 62 penetrating through the dielectric layer 30 and the second metal structure 64 and the fourth metal structure 68 penetrating through the dielectric layer 30, the buried oxide layer 212 and the semiconductor layer 214 of the second substrate 210, and the dielectric layer 220. That is, each of the second metal structure 64 and the fourth metal structure 68 is a through silicon via. For details of the first metal structure 62, the second metal structure 64 and the fourth metal structure 68, references may be made to the above description relating to the third metal structure 66 and are not repeated herein.

Figure 6:
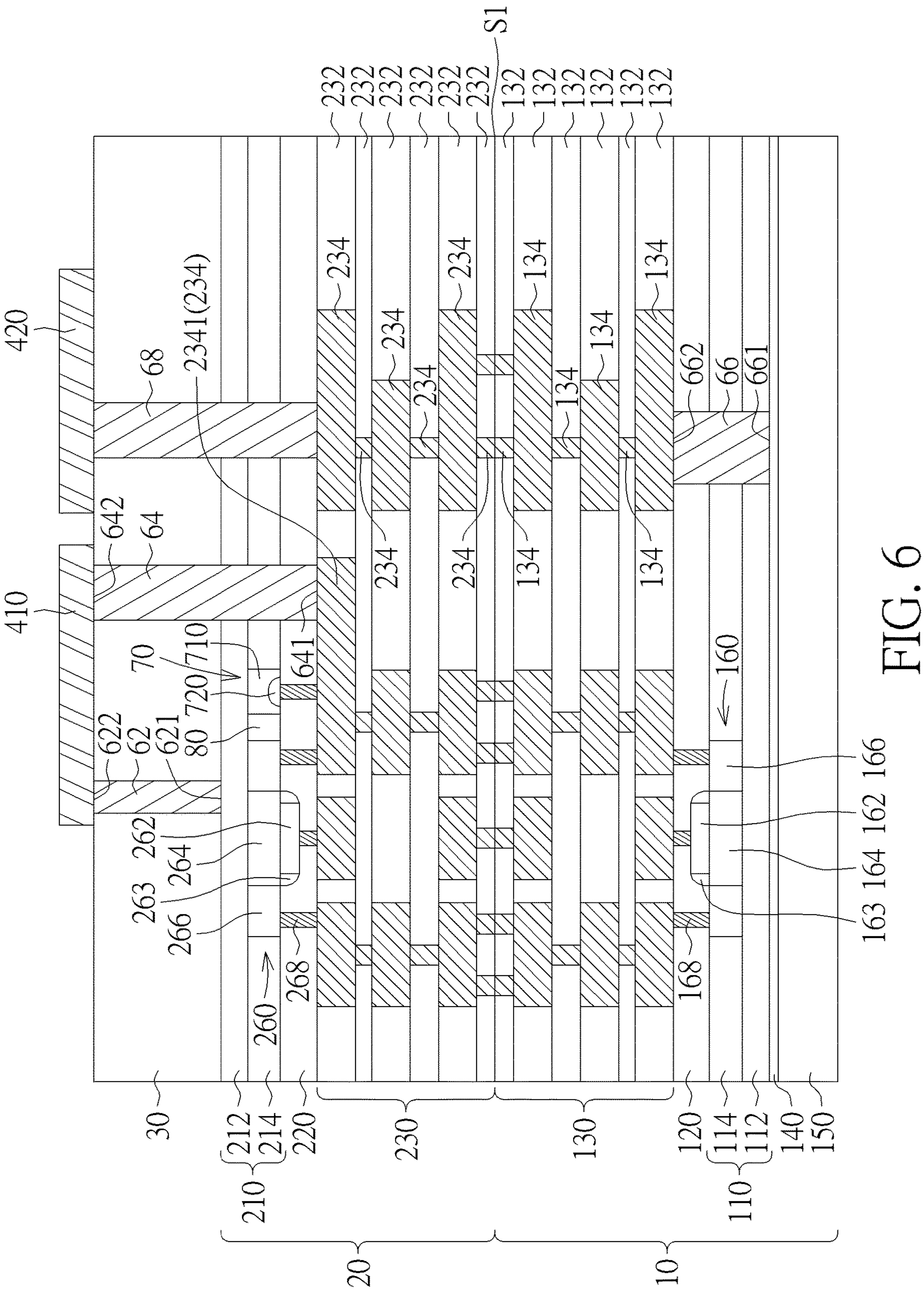

Next, as shown in FIG. 6, the first metal pad 410 and the second metal pad 420 are formed on the dielectric layer 30 to be the output/input bonding pads of the entire 3D IC (i.e., the semiconductor device 1). For example, a metal material layer (not shown) may be firstly formed on the dielectric layer 30, and then a portion of the metal material layer may be removed through semiconductor processes, such as lithography and etching processes, to form the first metal pad 410 and the second metal pad 420 which are separated from each other. The materials of the first metal pad 410 and the second metal pad 420 may include conductive metal materials, such as aluminum, titanium, tantalum, tungsten, niobium, molybdenum, copper or a combination thereof, but not limited thereto.

Figure 7:
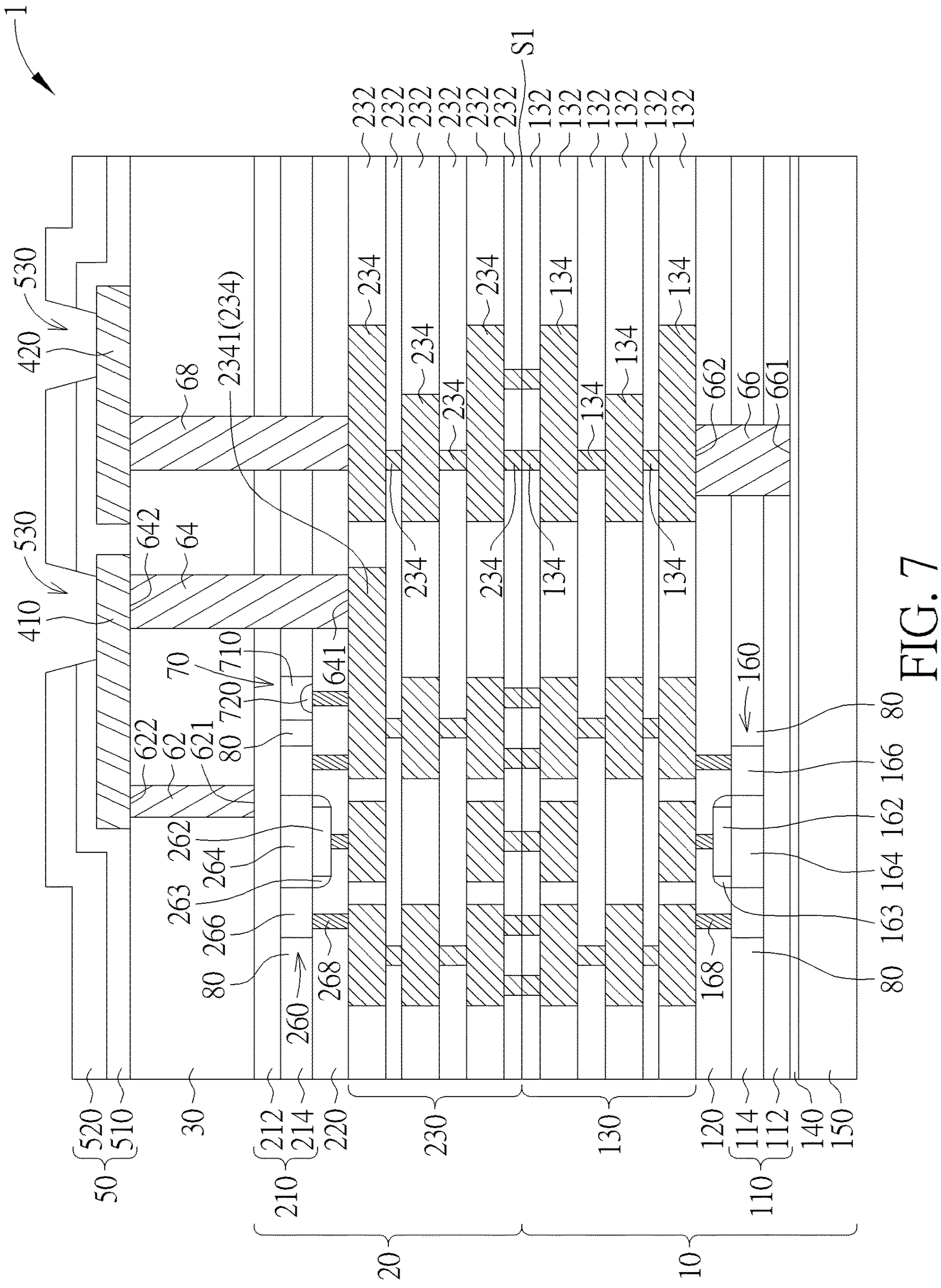

Next, as shown in FIG. 7, a protective layer 50 is formed on the dielectric layer 30, the first metal pad 410 and the second metal pad 420, in which the protective layer 50 partially covers the first metal pad 410 and the second metal pad 420. Herein, the protective layer 50 includes a first protective layer 510 and a second protective layer 520 from bottom to top. For example, a first protective material layer (not shown) and a second protective material layer (not shown) may be formed on the dielectric layer 30, the first metal pad 410 and the second metal pad 420, and then processes, such as lithography and etching processes, are performed to remove a portion of the first protective material layer and the second protective material layer to form two holes 530. Thereby, the fabrication of the first protective layer 510 and the second protective layer 520 is completed. The two holes 530 of the protective layer 50 expose the first metal pad 410 and the second metal pad 420, respectively. The materials of the first protective layer 510 and the second protective layer 520 may include dielectric materials, and the dielectric materials of the first protective layer 510 and the second protective layer 520 may independently include a nitride, a plasma enhanced oxide (PEOX), or a combination thereof. According to an embodiment, the dielectric material of the first protective layer 510 includes a plasma enhanced oxide, and the dielectric material of the second protective layer 520 includes a nitride. However, the present disclosure is not limited thereto. The number of layers and the material of the protective layer 50 may be adjusted according to actual needs. Thereby, the fabrication of the semiconductor device 1 is completed.

Please refer to FIG. 7, which is a schematic cross-sectional view of a semiconductor device 1 according to an embodiment of the present disclosure. The semiconductor device 1 includes the first wafer 10, the second wafer 20, the dielectric layer 30 and the first metal structure 62, and may optionally include the first metal pad 410, the second metal pad 420, the protective layer 50, the second metal structure 64 and the fourth metal structure 68. The first wafer 10 and the second wafer 20 are bonded with each other through the bonding interface S1. The dielectric layer 30 is disposed on the second wafer 20. The first metal pad 410 and the second metal pad 420 are disposed on the dielectric layer 30. The protective layer 50 is disposed on the dielectric layer 30, the first metal pad 410 and the second metal pad 420, and the protective layer 50 partially covers the first metal pad 410 and the second metal pad 420.

The first wafer 10 includes the first substrate 110 and the first interconnection layer 130 disposed on the first substrate 110. The second wafer 20 includes the second substrate 210 and the second interconnection layer 230. The second substrate 210 includes the buried oxide layer 212 and the semiconductor layer 214 disposed on the buried oxide layer 212. The second interconnection layer 230 is disposed on the semiconductor layer 214. The second interconnection layer 230 is bonded with the first interconnection layer 130. The dielectric layer 30 is disposed on the buried oxide layer 212 of the second substrate 210. The first metal structure 62 is disposed through the dielectric layer 30, in which the end 621 of the first metal structure 62 physically contacts the buried oxide layer 212, and the buried oxide layer 212 is grounded through the first metal structure 62. Herein, the end 621 of the first metal structure 62 physically contacts the buried oxide layer 212, and the other end 622 of the first metal structure 62 is connected with the first metal pad 410. That is, the buried oxide layer 212 can be grounded through the first metal structure 62 and the first metal pad 410.

As mentioned above, during the process of removing the semiconductor layer 216, charges may be accumulated in the buried oxide layer 212. In the present disclosure, at least one charge release path may be formed by the first metal structure 62 and the first metal pad 410. The at least one charge release path may be configured for transporting the charges accumulated in the buried oxide layer 212 to the outside, which is beneficial to improve the electrical performance of the second transistor 260. For example, it can prevent the decrease of the breakdown voltage of the second transistor 260.

Specifically, the first wafer 10 may include the supporting substrate 150, the trap rich layer 140, the first substrate 110, the dielectric layer 120 and the first interconnection layer 130 from bottom to top, and may further include the first transistor 160 and the third metal structure 66. The first substrate 110 includes the buried oxide layer 112 and the semiconductor layer 114. The semiconductor layer 114 is disposed on the buried oxide layer 112. The first interconnection layer 130 is disposed on the semiconductor layer 114 of the first substrate 110. Herein, the first interconnection layer 130 is disposed on the semiconductor layer 114 through the dielectric layer 120. The trap rich layer 140 is disposed on the buried oxide layer 112 of the first substrate 110. The first transistor 160 is disposed in the semiconductor layer 114. The first transistor 160 includes the well region 164 and the two source/drain regions 166 disposed in the semiconductor layer 114, the gate structure 162 disposed on the semiconductor layer 114, and the spacer 163 disposed on the sidewall of the gate structure 162. The gate structure 162 and the two source/drain regions 166 are electrically connected with the metal interconnections 134 in the first interconnection layer 130 through the contact plugs 168. The third metal structure 66 is disposed through the dielectric layer 120 and the semiconductor layer 114 and the buried oxide layer 112 of the first substrate 110. The end 661 of the third metal structure 66 physically contacts the trap rich layer 140, and the other end 662 of the third metal structure 66 is electrically connected with the second metal pad 420. Herein, the other end 662 of the third metal structure 66 is electrically connected with the second metal pad 420 through the metal interconnections 134 in the first interconnection layer 130, the metal interconnections 234 in the second interconnection layer 230 and the fourth metal structure 68.

The second wafer 20 may include the second substrate 210, the dielectric layer 220 and the second interconnection layer 230 from top to bottom, and may further include the second transistor 260 and the diode 70. The second substrate 210 includes the buried oxide layer 212 and the semiconductor layer 214. The semiconductor layer 214 is disposed on the buried oxide layer 212. The second interconnection layer 230 is disposed on the semiconductor layer 214 of the second substrate 210. Herein, the second interconnection layer 230 is disposed on the semiconductor layer 214 through the dielectric layer 220. The second transistor 260 and the diode 70 are disposed in the semiconductor layer 214. The second transistor 260 includes the well region 264 and the two source/drain regions 266 disposed in the semiconductor layer 214, the gate structure 262 disposed on the semiconductor layer 214, and the spacer 263 disposed on the sidewall of the gate structure 262. The diode 70 includes the N-type doped region 710 and the P-type doped region 720 disposed in the semiconductor layer 214, and the diode 70 directly or physically contacts the buried oxide layer 212. The gate structure 262, the second source/drain regions 266 and the P-type doped region 720 are electrically connected with the metal interconnections 234 in the second interconnection layer 230 through the contact plugs 268.

The second interconnection layer 230 includes the metal layer 2341. The metal layer 2341 is a portion of the metal interconnections 234 in the second interconnection layer 230 and is the portion of the metal interconnections 234 closest to the second substrate 210. One of the two source/drain regions 266 (herein, the source/drain region 266 at the right side) is electrically connected with the first metal pad 410 through the contact plug 268, the metal layer 2341 and the second metal structure 64, in which the end 641 of the second metal structure 64 is connected with the metal layer 2341, and the other end 642 of the second metal structure 64 is connected with the first metal pad 410. The diode 70 is electrically connected with the first metal pad 410. Herein, the diode 70 is electrically connected with the first metal pad 410 through the contact plug 268, the metal layer 2341 and the second metal structure 64. Thereby, the diode 70, the contact plug 268, the metal layer 2341, the second metal structure 64 and the first metal pad 410 may form a charge release path, which may transport the charges accumulated in the buried oxide layer 212 to the outside, thereby the electrical performance of the second transistor 260 may be maintained. For example, it can prevent the decrease of the breakdown voltage of the second transistor 260. Furthermore, the diode 70 can utilize the existing conductive paths of the second transistor 260 (i.e., the metal layer 2341, the second metal structure 64 and the first metal pad 410) to transport the charges accumulated in the buried oxide layer 212 to the outside without fabricating an additional conductive path, which is beneficial to simply the process.

Compared with the prior art, the semiconductor device of the present disclosure includes a first metal structure. An end of the first metal structure physically contacts the buried oxide layer, so that the buried oxide layer may be grounded through the first metal structure, which is beneficial to form a charge release path for transporting the charges accumulated in the buried oxide layer during the manufacturing process to the outside, which is beneficial to improve the electrical performance of the semiconductor device. The semiconductor device may further include a diode. The diode directly or physically contacts the buried oxide layer, so that the buried oxide layer may be grounded through the diode, which may provide another charge release path for transporting the charges accumulated in the buried oxide layer to the outside, so as to further improve the electrical performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a first wafer, comprising:
a first substrate; and
a first interconnection layer disposed on the first substrate;
a second wafer, comprising:
a second substrate comprising a buried oxide layer and a semiconductor layer directly disposed on the buried oxide layer; and
a second interconnection layer disposed on the semiconductor layer, wherein the second interconnection layer is bonded with the first interconnection layer;
a dielectric layer disposed on the buried oxide layer; and
a first metal structure disposed through the dielectric layer, wherein an end of the first metal structure physically contacts the buried oxide layer without penetrating the buried oxide layer, and the buried oxide layer is grounded through the first metal structure.

2. The semiconductor device of claim 1, further comprising:
a first metal pad disposed on the dielectric layer; and
a protective layer disposed on the dielectric layer and the first metal pad, wherein the protective layer partially covers the first metal pad, and another end of the first metal structure is connected with the first metal pad.

3. The semiconductor device of claim 2, wherein the second wafer further comprises a diode disposed in the semiconductor layer, and the diode is electrically connected with the first metal pad.

4. The semiconductor device of claim 3, wherein the second interconnection layer comprises a metal layer, the semiconductor device further comprises a second metal structure disposed through the second substrate and the dielectric layer, an end of the second metal structure is connected with the metal layer, another end of the second metal structure is connected with the first metal pad, and the diode is electrically connected with the first metal pad through the metal layer and the second metal structure.

5. The semiconductor device of claim 4, wherein the second wafer further comprises a transistor disposed in the semiconductor layer, the transistor comprises two source/drain regions, one of the two source/drain regions is connected with the first metal pad through the metal layer and the second metal structure.

6. The semiconductor device of claim 2, wherein the protective layer comprises a dielectric material.

7. The semiconductor device of claim 6, wherein the dielectric material comprises a nitride, a plasma enhanced oxide or a combination thereof.

8. The semiconductor device of claim 2, wherein the first substrate comprises a buried oxide layer and a semiconductor layer disposed on the buried oxide layer, and the first interconnection layer is disposed on the semiconductor layer of the first substrate.

9. The semiconductor device of claim 8, wherein the first wafer further comprises a trap rich layer disposed on the buried oxide layer of the first substrate.

10. The semiconductor device of claim 9, further comprising:

a second metal pad disposed on the dielectric layer, wherein the protective layer partially covers the second metal pad; and a third metal structure disposed through the buried oxide layer and the semiconductor layer of the first substrate, wherein an end of the third metal structure physically contacts the trap rich layer, and another end of the third metal structure is connected with the second metal pad.

* * * * *